(12) United States Patent
Wang et al.

(10) Patent No.: US 12,100,586 B2
(45) Date of Patent: Sep. 24, 2024

(54) SUBSTRATE CLEANING METHOD AND APPARATUS

(71) Applicant: ACM Research (Shanghai) Inc., Shanghai (CN)

(72) Inventors: Wenjun Wang, Shanghai (CN); Ting Yao, Shanghai (CN); Xiaoyan Zhang, Shanghai (CN); Fuping Chen, Shanghai (CN); Hui Wang, Shanghai (CN)

(73) Assignee: ACM RESEARCH (SHANGHAI) INC., Shanghai (CN)

( * ) Notice: Subject to any disclaimer, the term of this patent is extended or adjusted under 35 U.S.C. 154(b) by 0 days.

(21) Appl. No.: 17/755,505

(22) PCT Filed: Nov. 1, 2019

(86) PCT No.: PCT/CN2019/114972
§ 371 (c)(1),
(2) Date: Apr. 29, 2022

(87) PCT Pub. No.: WO2021/081975
PCT Pub. Date: May 6, 2021

(65) Prior Publication Data
US 2022/0351962 A1 Nov. 3, 2022

(51) Int. Cl.
*H01L 21/67* (2006.01)
*B08B 3/02* (2006.01)
(Continued)

(52) U.S. Cl.
CPC ........ *H01L 21/02057* (2013.01); *B08B 3/022* (2013.01); *B08B 3/041* (2013.01);
(Continued)

(58) Field of Classification Search
None
See application file for complete search history.

(56) References Cited

U.S. PATENT DOCUMENTS

2009/0301518 A1* 12/2009 Oikawa ............ H01L 21/67051
134/184
2012/0318304 A1* 12/2012 Wang ................ H01L 21/67051
134/144
(Continued)

FOREIGN PATENT DOCUMENTS

| CN | 103489814 A | 1/2014 |
| CN | 105414084 A | 3/2016 |

(Continued)

OTHER PUBLICATIONS

International Search Report issued in International Application No. PCT/CN2019/114972 dated Aug. 11, 2020 (4 pages).
(Continued)

*Primary Examiner* — Mikhail Kornakov
*Assistant Examiner* — Ryan L Coleman
(74) *Attorney, Agent, or Firm* — Osha Bergman Watanabe & Burton LLP

(57) ABSTRACT

A method for cleaning a substrate with pattern structures comprises the following steps: using gas-liquid atomization to clean a substrate surface (601); using TEBO megasonic to clean the substrate surface (602); and drying the substrate (603). The TEBO megasonic cleaning is used to remove small size particles on the substrate and the gas-liquid atomization cleaning is used to remove large size particles on the substrate. The method enables achieving an effect of cleaning the substrate without or with less device damage. A substrate cleaning apparatus is also provided.

4 Claims, 15 Drawing Sheets

(51) Int. Cl.
*B08B 3/04* (2006.01)
*B08B 3/12* (2006.01)
*H01L 21/02* (2006.01)

(52) U.S. Cl.
CPC .......... *B08B 3/12* (2013.01); *H01L 21/67051* (2013.01); *B08B 2220/04* (2013.01)

(56) References Cited

U.S. PATENT DOCUMENTS

2017/0066021 A1    3/2017  Chien et al.
2018/0033654 A1*   2/2018  Chu ......................... B08B 3/02
2018/0151398 A1*   5/2018  Wang ....................... B08B 3/12

FOREIGN PATENT DOCUMENTS

CN    106856161 A    6/2017
CN    107636799 A    1/2018

OTHER PUBLICATIONS

Written Opinion issued in International Application No. PCT/CN2019/114972 dated Aug. 11, 2020 (4 pages).

* cited by examiner

| TEBO Megasonic Cleaning ||||||||||
| Recipe Steps | Wafer Speed (rpm) | Process Time (sec) | Chemical | Flow Rate(lpm) | Temperature (°C) | Chemical Mix Ratio | Power(Watts) | Duty cycle(%) | Pulse Period(ms) |
| --- | --- | --- | --- | --- | --- | --- | --- | --- | --- |
| Step1: | 300-1000 | 5-60 | CO2 DIW | 1.2-2.0 | 23-65 | 0.05-18MΩ*cm | | | |
| Step2: | 10-100 | 15-300 | SC-1 | 1.2-2.0 | 23-65 | 1:4:20-1:1:500 | 10-100 | 1%-5% | 2-10 |
| Step3: | 300-1000 | 5-60 | CO2 DIW | 1.2-2.0 | 23-65 | 0.05-18MΩ*cm | | | |
| Step4: | 2000-2500 | 20-60 | N2 | 5-30 | 23-65 | | | | |

FIG 2A

| Test Wafer | Wafer-1 || Wafer-2 || Wafer-3 || Wafer-4 || Particle Remove Efficiency PRE(%) |
| --- | --- | --- | --- | --- | --- | --- | --- | --- | --- |
| Particle Size Distribution | PRE | POST | PRE | POST | PRE | POST | PRE | POST | |
| 0.1um | 2 | 0 | 0 | 0 | 0 | 0 | 0 | 0 | higher |
| 0.2um | 4 | 0 | 3 | 0 | 3 | 0 | 0 | 0 | |
| 0.5um | 2 | 0 | 3 | 0 | 1 | 0 | 4 | 1 | |
| 1um | 3 | 1 | 2 | 1 | 1 | 0 | 2 | 1 | Lower |
| >1um | 2 | 2 | 1 | 0 | 1 | 1 | 1 | 1 | |

FIG 2B

| | | | Gas-Liquid Atomization Cleaning | | | | Gas-Liquid Atomization | |
|---|---|---|---|---|---|---|---|---|
| Recipe Steps | Wafer Speed (rpm) | Process Time (sec) | Chemical | Flow Rate(lpm) | Temperature (°C) | Chemical Mix Ratio | Gas Flow(lpm) | SC-1 Flow(mlpm) |
| Step1: | 300-1000 | 5-60 | CO2 DIW | 1.2-2.0 | 23-65 | 0.05-18MΩ*cm | | |
| Step2: | 300-1000 | 15-60 | SC-1 | 0.1-0.3 | 23-65 | 1:4:20-1:1:500 | 10-100 | 100-300 |
| Step3: | 300-1000 | 5-60 | CO2 DIW | 1.2-2.0 | 23-65 | 0.05-18MΩ*cm | | |
| Step4: | 2000-2500 | 20-60 | N2 | 5-30 | 23-65 | | | |

FIG 4A

| Test Wafer | Wafer-1 | | Wafer-2 | | Wafer-3 | | Wafer-4 | | Particle Remove Efficiency PRE(%) |
|---|---|---|---|---|---|---|---|---|---|
| Particle Size Distribution | PRE | POST | PRE | POST | PRE | POST | PRE | POST | |
| 0.1um | 1 | 1 | 2 | 2 | 3 | 2 | 1 | 1 | |
| 0.2um | 0 | 0 | 0 | 3 | 6 | 3 | 1 | 0 | Lower |
| 0.5um | 2 | 0 | 2 | 0 | 3 | 0 | 3 | 1 | |
| 1um | 2 | 0 | 1 | 0 | 2 | 0 | 2 | 0 | 100% |
| >1um | 1 | 0 | 1 | 0 | 0 | 0 | 0 | 0 | |

FIG 4B

Gas-Liquid Atomization Cleaning + TEBO Megasonic Cleaning Process Conditions

| Recipe Steps | Wafer Speed (rpm) | Process Time (sec) | Chemical | Flow Rate(lpm) | Temperature (°C) | Chemical Mix Ratio | Gas-Liquid Atomization | |
|---|---|---|---|---|---|---|---|---|
| | | | | | | | Gas Flow(lpm) | SC-1 Flow(mlpm) |
| Step1: | 300-1000 | 5-60 | CO2 DIW | 1.2-2.0 | 23-65 | 0.05-18MΩ*cm | | |
| Step2: | 300-1000 | 15-60 | SC-1 | 0.1-0.3 | 23-65 | 1:4.20-1:1.500 | 10-100 | 100-300 |
| Step3: | 300-1000 | 5-60 | CO2 DIW | 1.2-2.0 | 23-65 | 0.05-18MΩ*cm | | |

| | | | | | | | TEBO Megasonic | |
|---|---|---|---|---|---|---|---|---|
| | | | | | | | Power(Watts) | Duty cycle(%) | Pulse Periods(ms) |
| Step4: | 10-100 | 15-300 | SC-1 | 1.2-2.0 | 23-65 | 1:4.20-1:1.500 | 10-100 | 1%-5% | 2-10 |
| Step5: | 300-1000 | 5-60 | CO2 DIW | 1.2-2.0 | 23-65 | 0.05-18MΩ*cm | | | |
| Step6: | 2000-2500 | 20-60 | N2 | 5-30 | 23-65 | | | | |

FIG 8

| Test Wafer | Wafer-1 | | Wafer-2 | | Wafer-3 | | Wafer-4 | | Particle Remove Efficiency PRE(%) |
|---|---|---|---|---|---|---|---|---|---|
| Particle Size Distribution | PRE | POST | PRE | POST | PRE | POST | PRE | POST | |
| 0.1um | 2 | 0 | 0 | 0 | 0 | 0 | 0 | 0 | 100% |
| 0.2um | 4 | 0 | 3 | 0 | 3 | 0 | 0 | 0 | |
| 0.5um | 2 | 0 | 1 | 0 | 2 | 0 | 4 | 0 | |
| 1um | 3 | 0 | 2 | 0 | 0 | 0 | 1 | 0 | 100% |
| >1um | 0 | 0 | 1 | 0 | 0 | 0 | 0 | 0 | |

FIG 9

SUBSTRATE CLEANING METHOD AND APPARATUS

FIELD OF THE INVENTION

The present invention generally relates to a semiconductor wet cleaning field, and more particularly to a substrate cleaning method and a substrate cleaning apparatus.

BACKGROUND

With the volume of semiconductor chips becoming smaller and smaller, the major challenge of semiconductor cleaning technology is to control product defect rate and meanwhile improve particle remove efficiency (PRE). While cleaning substrates comprising pattern structures, whether the pattern structures are cleaned or not is an important factor affecting the yield of devices. If the pattern structures are not cleaned thoroughly, there are particles remaining in the pattern structures, which will cause subsequent electrical failure, short circuit or circuit break.

Further, with the rapid development of semiconductor manufacturing technology and R&D capability, the feature size of devices gradually decreases. When the technical nodes reach 28 nm or less, the control of key sizes is required to be higher. In order to reduce or even eliminate the impact on the key sizes, some mild and dilute chemical solutions are needed, such as SC1, SC2, SPM, hydrofluoric acid, etc. At the same time, in order to enhance the cleaning effect, physical cleaning is often used to assist chemical solution cleaning, for example, ultrasonic or megasonic cleaning, gas-liquid atomization cleaning. However, at present, from the industry's cleaning situation, the cleaning efficiency is always unsatisfactory under the case of the single use of acoustic wave cleaning or gas-liquid atomization cleaning, because it is difficult to effectively control the acoustic energy or the gas-liquid atomization flow rate in cleaning.

For the ultrasonic or megasonic assisted wet cleaning, the acoustic energy is the key factor that restricts the cleaning effect. Take megasonic cleaning as an example, the mechanism of megasonic cleaning is to use high frequency (0.8-1.0 MHz) alternating current to excite the piezoelectric resonator crystal, which causes vibration to produce sonic waves, which creates a thin acoustic boundary layer near the surface of the substrate and the pressure generated in the solution. The high energy of vibration and ultra-high frequency result in a great sound pressure gradient, particle velocity and sound flow, combined with the chemical reaction of chemical cleaning agents, together to clean the substrate.

Ultrasonic (Megasonic) waves act on the liquid medium. Because the alternating current excites the piezoelectric resonator to produce alternating sound pressure, a certain point in the medium undergoes periodic compression and expansion. The cavitation bubble generation mechanism is: when the amplitude of the alternating sound pressure is less than the liquid saturated vapor pressure at the current temperature of the point, a negative pressure occurs, and the gas originally dissolved in the liquid is precipitated as a gas core, and the cavitation nucleus is under the action of negative pressure, grows rapidly in the sonic expansion phase, ranging from a few microns to tens of microns in diameter. The mechanism of collapse of cavitation bubbles is: in the subsequent coming compression phase, the bubble volume decreases sharply under positive pressure, which in turn produces nonlinear oscillations (steady-state cavitation), or the sound pressure reaches a certain threshold (cavitation threshold) and after rapid closure until collapse (instantaneous cavitation), the energy generated is extremely large enough to overcome the particle adhesion on the surface of the object. In the small space area inside and outside the bubble, before the bubble collapses, the bubble will produce high temperature and high pressure (5000K, 1800 atm) and even sonoluminescence. Therefore, the gas in the bubble causes physicochemical changes that are difficult to occur at normal temperature. Outside of the bubble, due to the violent collapse of the bubble, the collapse will produce a strong outward-radiating impact micro-jet with a speed of several Mach. At the same time, the release of high pressure inside the bubble and the rapid drop of high temperature can form a great pressure gradient and temperature change rate. During traditional ultrasonic or megasonic cleaning, removal of particles is typically achieved through acoustic streaming and cavitation phenomenas.

As the semiconductor technology nodes continuously shrink, the aspect ratio of trenches or vias increases and the pattern structures becomes more complex and more fragile, the traditional ultrasonic or megasonic cleaning method is facing more and more challenges. The shock waves and micro jets generated from transient bubbles collapse easily cause pattern structures damage. FIGS. 1A-1D illustrate the damage of the pattern structures caused by the traditional ultrasonic or megasonic cleaning. Thereinto, FIG. 1A shows the distribution of SEM scanning points. Before cleaning process, randomly picked 50 points for SEM scanning as pre data. After ultrasonic or megasonic cleaning, scan these points again to check the pattern structures whether collapse or not. FIGS. 1B-1D are SEM pictures showing pattern structures damages.

Moreover, particles with different sizes may be attached on the substrate during IC manufacturing process. Single physical-assisted wet cleaning method cannot remove all size of particles at one time. Therefore, a new substrate cleaning method and a new substrate cleaning apparatus need to be developed to remove both large size particles and small size particles, which removes all-size particles efficiently without or with less pattern structures damages.

SUMMARY

Accordingly, an object of the present invention is to provide a substrate cleaning method and a substrate cleaning apparatus for removing particles on substrates and achieving the maximum particle remove efficiency without or with less device damage.

According to an embodiment of the present invention, a method for cleaning a substrate with pattern structures comprises the following steps: using gas-liquid atomization to clean a substrate surface; using TEBO megasonic to clean the substrate surface; and drying the substrate.

According to another embodiment of the present invention, a method for cleaning a substrate with pattern structures comprises the following steps: using TEBO megasonic to clean a substrate surface; using gas-liquid atomization to clean the substrate surface; and drying the substrate.

According to an embodiment of the present invention, an apparatus for cleaning a substrate with pattern structures comprises: a substrate holding device, configured to hold a substrate; a megasonic cleaning device, configured to provide TEBO megasonic cleaning; and a gas-liquid atomization cleaning device, configured to provide gas-liquid atomization cleaning.

As described above, the present invention uses TEBO megasonic cleaning to remove small size particles on the substrate and uses gas-liquid atomization cleaning to remove large size particles on the substrate and then dry the substrate in one recipe, achieving an excellent cleaning effect without or with less device damage.

BRIEF DESCRIPTION OF THE DRAWINGS

FIG. 2A is a table showing process conditions of a TEBO megasonic assisted wet cleaning procedure according to the present invention. FIG. 2B is a table showing a test result by employing the TEBO megasonic assisted wet cleaning procedure.

FIG. 4A is a table showing process conditions of a gas-liquid atomization assisted wet cleaning procedure. FIG. 4B is a table showing a test result by employing the gas-liquid atomization assisted wet cleaning procedure.

FIG. 8 is a table showing process conditions of a substrate cleaning method according to an exemplary embodiment of the present invention.

FIG. 9 is a table showing a test result by employing the substrate cleaning method of the present invention.

DETAILED DESCRIPTION

In the traditional ultrasonic or megasonic assisted wet cleaning, pattern structures on a substrate are easily damaged by the micro-jet shock wave produced by the explosion of transient cavitation bubbles. In order to solve the problem, a new acoustic wave cleaning technology called Timely Energized Bubble Oscillation (TEBO) is developed to clean a substrate comprising pattern structures without pattern structures damages. The TEBO is a technology that controls the bubble cavitation generated by an ultra or mega sonic device during the cleaning process to achieve a stable or controlled cavitation on the entire semiconductor wafer, which removes particles efficiently without damaging the device structure on the semiconductor wafer. The entire contents of PCT patent application PCT/CN2015/079342, filed on May 20, 2015 are incorporated herein by reference.

Referring to FIG. 2A, a TEBO megasonic assisted wet cleaning procedure is disclosed according to the present invention. The TEBO megasonic assisted wet cleaning procedure comprises the following steps.

Step 1: pre-rinsing a wafer comprising pattern structures by using carbon dioxide deionized water for 5-60 seconds. The pre-rinsing is performed by delivering the carbon dioxide deionized water at a flow rate of 1.2-2.0 lpm and a temperature of 23-65° C. onto the wafer being rotated at a speed of 300-1000 rpm. The conductivity of carbon dioxide deionized water is 0.05-18 MΩ*cm.

Step 2: cleaning the wafer by employing a TEBO megasonic and SC1 for 15-300 seconds. The cleaning is performed by delivering the SC1 at a flow rate of 1.2-2.0 lpm and a temperature of 23-65° C. onto the wafer being rotated at a speed of 10-100 rpm. The chemical mix ratio of SC1 ($NH_4OH:H_2O_2:H_2O$) is 1:4:20-1:1:500. The power of megasonic wave is 10-100 watts. The duty cycle of power on is 1%-5%. The pulse period is 2-10 ms.

Step 3: post-rinsing the wafer by using carbon dioxide deionized water for 5-60 seconds. The post-rinsing is performed by delivering the carbon dioxide deionized water at a flow rate of 1.2-2.0 lpm and a temperature of 23-65° C. onto the wafer being rotated at a speed of 300-1000 rpm. The conductivity of carbon dioxide deionized water is 0.05-18 MΩ*cm.

Step 4: drying the wafer. The drying is performed by spraying nitrogen at a flow rate of 5-30 lpm and a temperature of 23-65° C. onto the wafer being rotated at a speed of 2000-2500 rpm for 20-60 seconds.

Figure 1A:
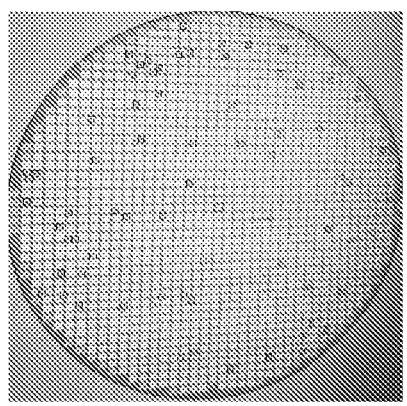
FIG. 1A shows the distribution of SEM scanning points.
Figure 1B:
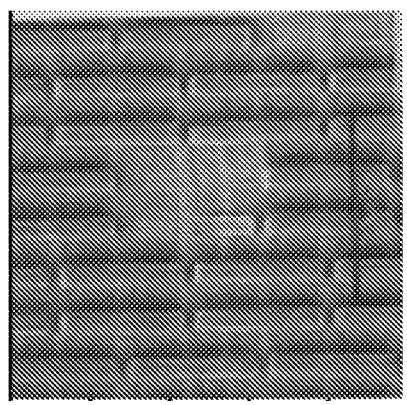
FIGS. 1B-1D are SEM pictures showing pattern structures damages caused by traditional ultrasonic or megasonic cleaning.
Figure 1C:
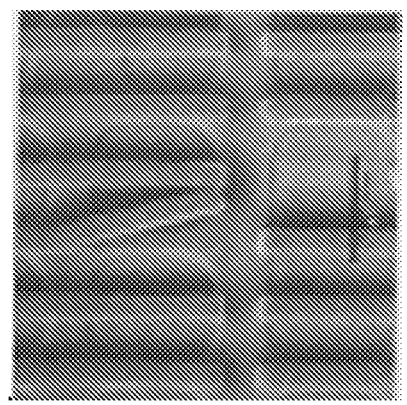
Figure 1D:
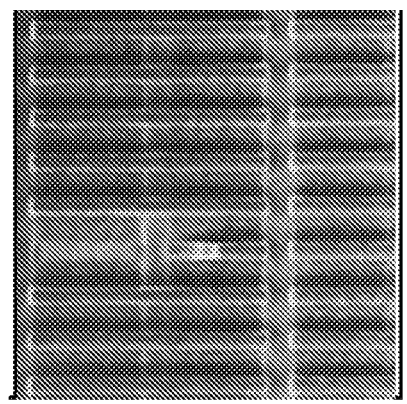
Figure 2C:
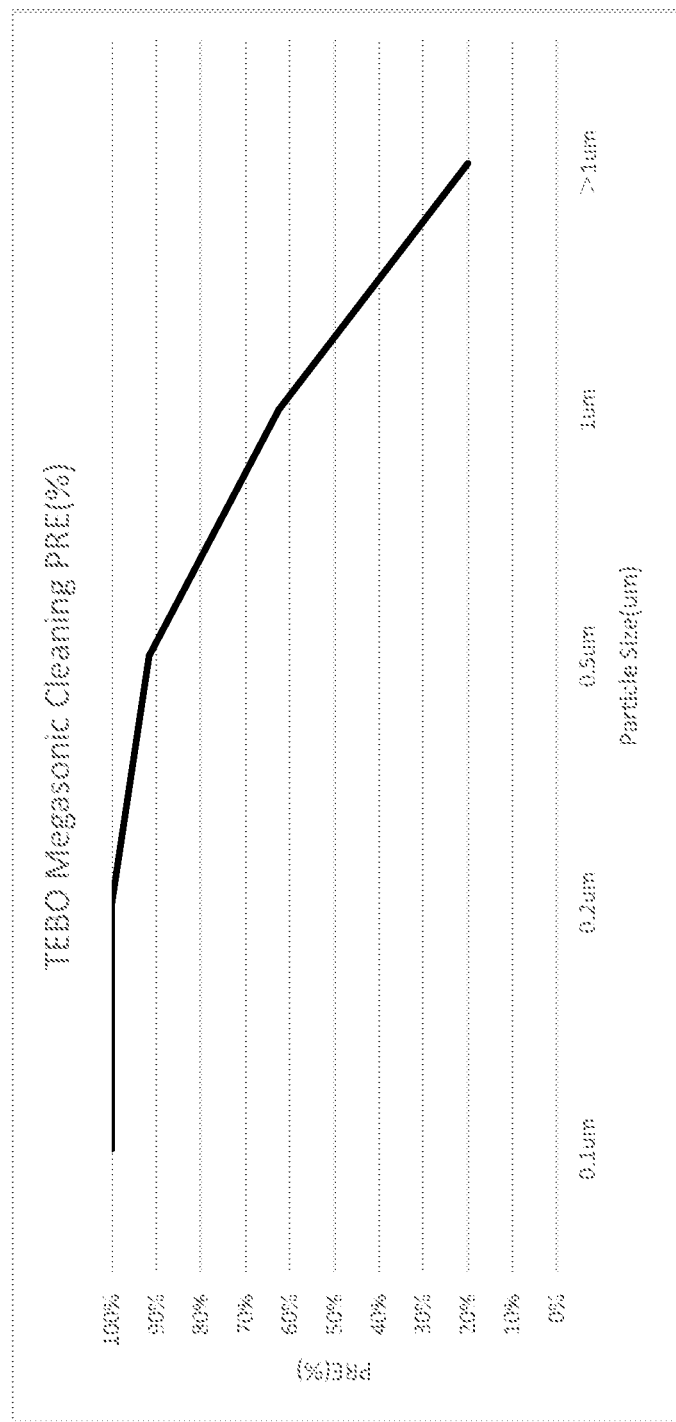
FIG. 2C is a graph showing particle remove efficiency (PRE) against particle size by employing the TEBO megasonic assisted wet cleaning procedure.

FIG. 2B is a table showing a test result by employing the TEBO megasonic assisted wet cleaning procedure to clean wafers. The test result shows that the particle remove efficiency of small particles which size is 0.5 um or less than 0.5 um is high but the particle remove efficiency of large particles which size is greater than 0.5 um is low. It can thus be seen that the TEBO megasonic assisted wet cleaning is capable of removing small particles which size is 0.5 um or less than 0.5 um. FIG. 2C is a graph showing particle remove efficiency (PRE) against particle size by employing the TEBO megasonic assisted wet cleaning to clean wafers. The graph shows that with the increase of particle size, the particle remove efficiency (PRE) decreases gradually while using the TEBO megasonic assisted wet cleaning technology to remove particles on the wafers comprising pattern structures. Hence, the TEBO megasonic cleaning technology can effectively remove small particles which size is 0.5 um or less than 0.5 um without or with less pattern structures damage, but cannot effectively remove large particles which size is greater than 0.5 um without pattern structures damage. Compared with the traditional megasonic cleaning method, for TEBO cleaning technology, the flow generated from oscillating bubbles, known as microstreaming, is considered to play a major role in particle removal, whereas the shock waves and micro jets generated from transient bubbles are controlled. So TEBO cleaning technology has excellent small size particle remove efficiency, while a weaker remove capability for large particles.

In the present invention, the TEBO megasonic cleaning technology solves the problem of removing small size particles in the semiconductor manufacturing filed. However, in the manufacturing of semiconductor devices, in addition to small size particles on substrates, there are also large size particles on the substrates. Therefore, not only small size particles need to be removed, but also large size particles need to be removed.

Figure 3:
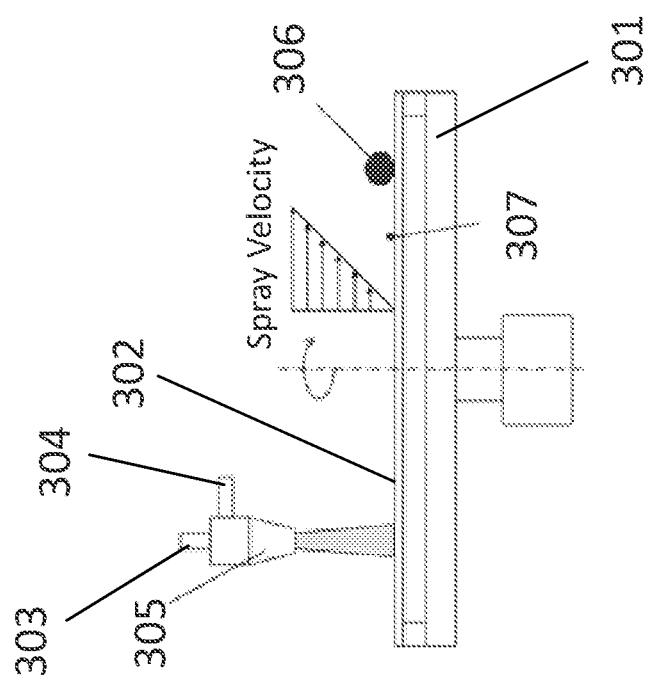
FIG. 3 is a schematic view showing a gas-liquid atomization cleaning apparatus.

Referring to FIG. 3, a schematic view of a gas-liquid atomization cleaning apparatus is shown. The gas-liquid atomization cleaning apparatus includes a substrate chuck 301, a liquid pipeline 303, a gas pipeline 304 and a jet-spray nozzle 305. Both the gas pipeline 304 and the liquid pipeline 303 connect to the jet-spray nozzle 305. The gas in the gas pipeline 304 is preferable $N_2$, $CO_2$, compressed air, etc. The liquid in the liquid pipeline 303 is preferable chemical liquid or deionized water, etc. Gas and liquid can be determined according to process needs. When cleaning a substrate 302, the substrate 302 is positioned on the substrate chuck 301. The substrate chuck 301 is driven to rotate at a certain speed so that the substrate 302 rotates along with the substrate chuck 301. A cleaning liquid is firstly sprayed onto the surface of the substrate 302 for pre-rinsing, then the jet-spray nozzle 305 sprays cleaning liquid, which was atomized to generate fine droplets and accelerated by pressurized gas through the jet-spray nozzle 305 onto the surface of the substrate 302, to promote the removal of particles on the substrate 302. The jet-spray nozzle 305 can scan across the substrate 302, and the distance between the jet-spray nozzle 305 and the surface of the substrate 302 can be changed flexibly during jet spraying. Spray cleaning consists of the synergistic effect of millions of fine droplets on the substrate surface. This is expected to lead to a thin liquid film on the substrate 302, and the droplet velocity is the most important parameter for particle removal. In order to remove a particle by the van der Waals-forces acting on it, the surrounding liquid needs to have an enough velocity, however, removal forces are proportional to the second or third power of particle radius and therefore decrease at a higher rate. Thus particles of smaller sizes are more difficult to remove. Generally the gas-liquid atomization cleaning is capable of effectively removing the large size particles 306 but it is difficult to remove small size particles 307, as well as particles in trenches and vias.

With reference to FIG. 4A, a gas-liquid atomization assisted wet cleaning procedure is disclosed according to the present invention. The gas-liquid atomization assisted wet cleaning procedure includes the following steps.

Step 1: pre-rinsing a wafer comprising pattern structures by using carbon dioxide deionized water for 5-60 seconds. The pre-rinsing is performed by delivering the carbon dioxide deionized water at a flow rate of 1.2-2.0 lpm and a temperature of 23-65° C. onto the wafer being rotated at a speed of 300-1000 rpm. The conductivity of carbon dioxide deionized water is 0.05-18 MΩ*cm.

Step 2: cleaning the wafer by employing gas-liquid atomization for 15-60 seconds. The gas can be $N_2$ and the gas flow rate is 10-100 lpm. The liquid is SC1 and the liquid flow rate is 0.1-0.3 lpm. The temperature is 23-65° C. The rotation speed of the wafer is 300-1000 rpm. The chemical mix ratio of SC1 ($NH_4OH:H_2O_2:H_2O$) is 1:4:20-1:1:500.

Step 3: post-rinsing the wafer by using carbon dioxide deionized water for 5-60 seconds. The post-rinsing is performed by delivering the carbon dioxide deionized water at a flow rate of 1.2-2.0 lpm and a temperature of 23-65° C. onto the wafer being rotated at a speed of 300-1000 rpm. The conductivity of carbon dioxide deionized water is 0.05-18 MΩ*cm.

Step 4: drying the wafer. The drying is performed by spraying nitrogen at a flow rate of 5-30 lpm and a temperature of 23-65° C. onto the wafer being rotated at a speed of 2000-2500 rpm for 20-60 seconds.

Figure 4C:
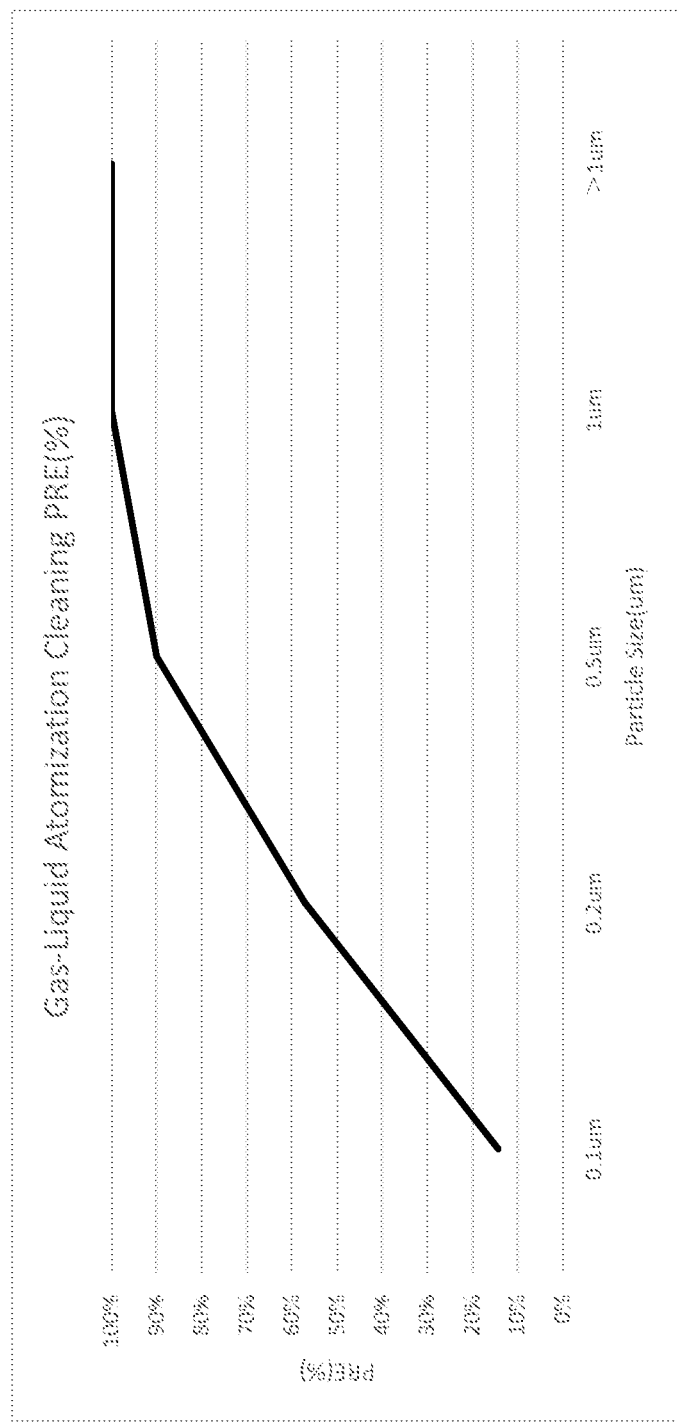
FIG. 4C is a graph showing particle remove efficiency (PRE) against particle size by employing the gas-liquid atomization assisted wet cleaning procedure.

Please refer to FIG. 4B and FIG. 4C. FIG. 4B is a table showing a test result by employing the gas-liquid atomization assisted wet cleaning procedure to clean wafers. The test result shows that the gas-liquid atomization cleaning can effectively remove large particles which size is greater than 0.5 um and the particle remove efficiency of the large particles is high which almost reaches 100%. However, the gas-liquid atomization cleaning cannot effectively remove small particles which size is 0.5 um or less than 0.5 um. The particle remove efficiency of the small particles is low by employing the gas-liquid atomization cleaning to clean wafers. FIG. 4C is a graph showing particle remove efficiency (PRE) against particle size by employing the gas-liquid atomization assisted wet cleaning procedure to clean wafers. FIG. 4C shows that the particle remove efficiency gradually increases with the increase of particle size.

Figure 5:
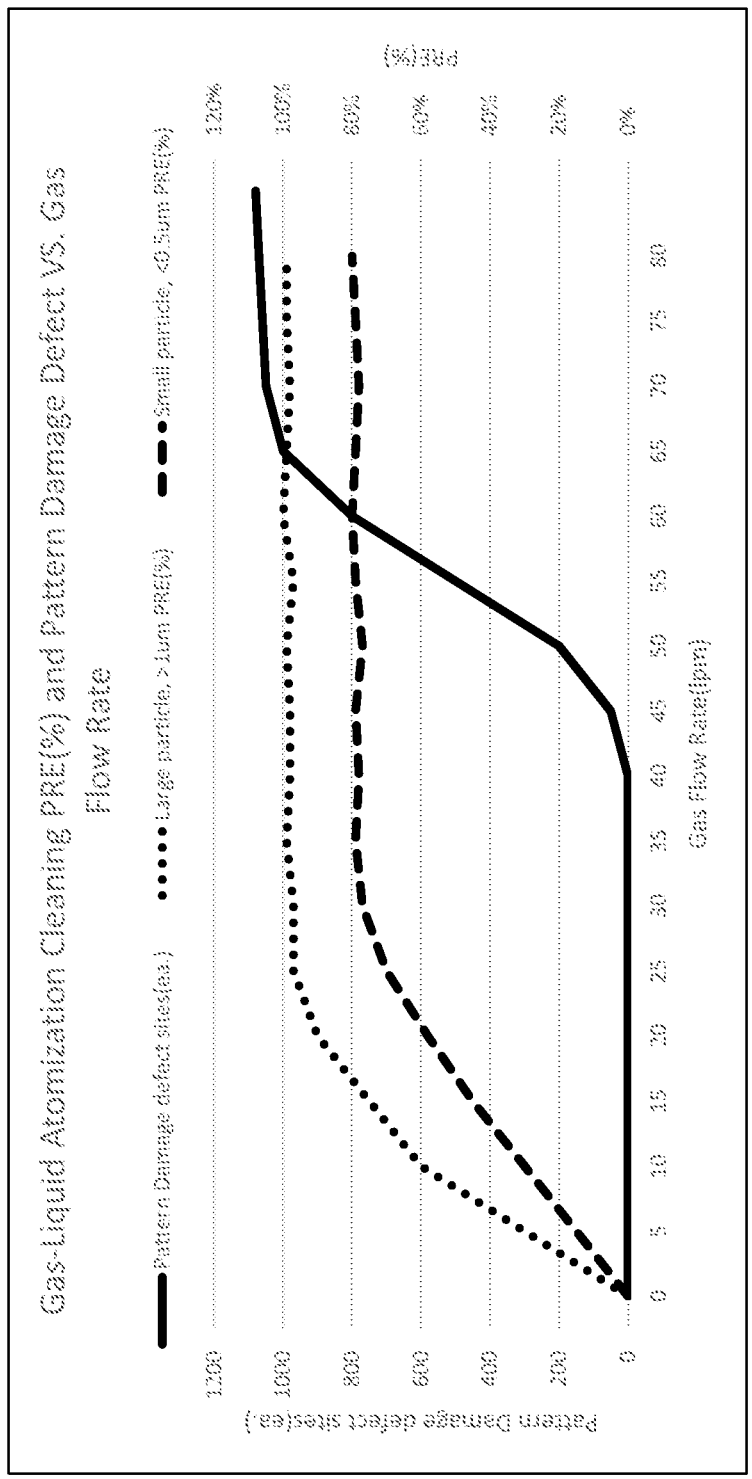
FIG. 5 is a graph showing particle remove efficiency (PRE) and pattern damage defect against gas flow rate by employing the gas-liquid atomization assisted wet cleaning.

Referring to FIG. 5, FIG. 5 is a graph showing particle remove efficiency (PRE) and pattern damage defect against gas flow rate by employing the gas-liquid atomization assisted wet cleaning to clean wafers comprising pattern structures. FIG. 5 shows that in a certain range of gas flow rate, increasing gas flow rate can increase particle remove efficiency of large size particles and small size particles without pattern structures damage. However, when the gas flow rate continues to increase, the particle remove efficiency of large size particles and small size particles does not increase. Not only that, the pattern structures will be damaged if continually increase the gas flow rate. By increasing the gas flow rate to improve the cleaning effect of small size particles, it also increases the risk of collapse of the pattern structures. Therefore, it is not feasible to improve the particle remove efficiency of small size particles by increasing the gas flow rate.

Figure 6:
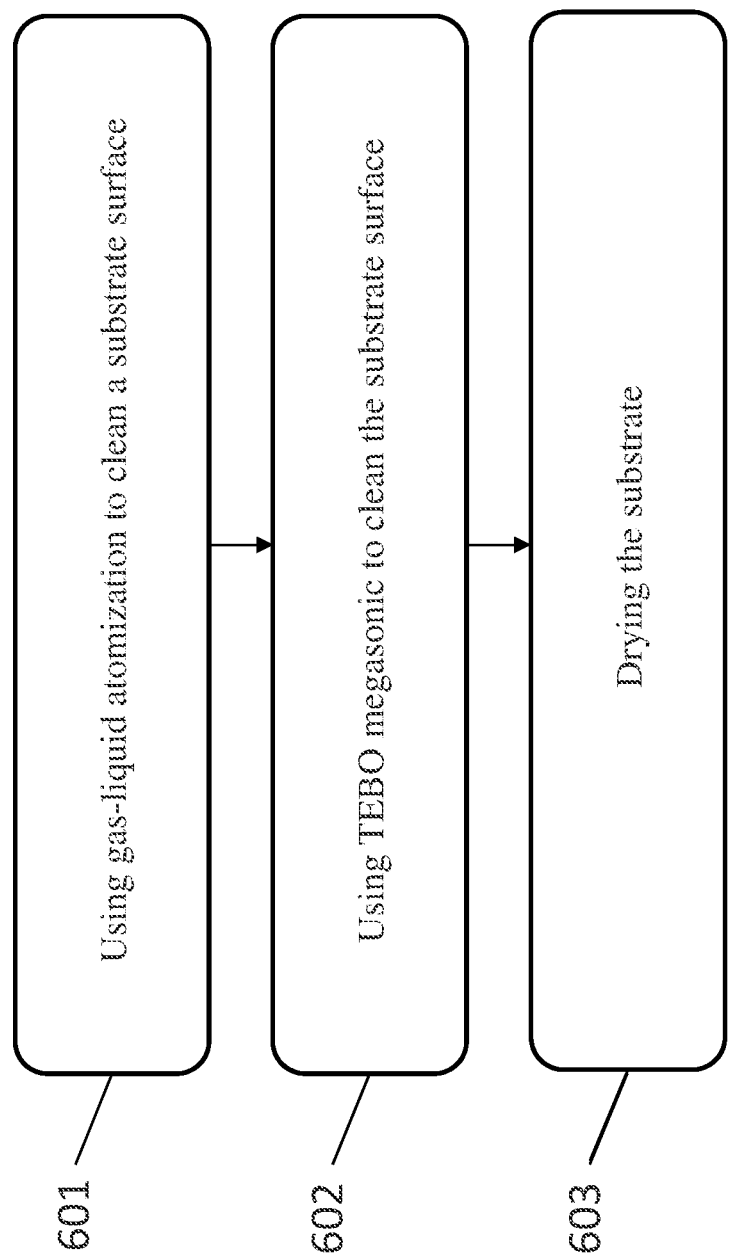
FIG. 6 is a flow chart showing a substrate cleaning method according to an exemplary embodiment of the present invention.

Therefore, referring to FIG. 6, according to an embodiment of the present invention, a method for cleaning a substrate with pattern structures is provided, the method comprising the following steps:

Step 601: using gas-liquid atomization to clean a substrate surface. The gas can be selected $N_2$, $CO_2$, compressed air, etc. The liquid can be selected carbon dioxide deionized water, DIW, SC1 or some other diluted chemicals. In this step, using gas-liquid atomization to clean the substrate surface can remove large size particles on the substrate, loosen the adhesion between particles and the substrate surface, and break up some of cluster polymeric particles.

Step 602: using TEBO megasonic to clean the substrate surface. TEBO megasonic combing with carbon dioxide deionized water, DIW, SC1 or some other diluted chemicals is used to clean the substrate surface, which can remove the substrate surface contaminants not completely removed in the previous step and small size particles. Since the particles adhesion has been loosened and the cluster polymeric particles have been broken up into small size particles in the previous step, TEBO megasonic is capable of easily removing these particles, improving particle remove efficiency.

Step 603: drying the substrate. High-speed rotary combining with nitrogen drying or IPA drying or other specially dried chemical solutions can be used to dry the substrate.

The step 601 and the step 602 can be performed alternatively several times to improve cleaning efficiency.

After the step 602, reuse gas-liquid atomization to clean the substrate surface.

Before the step 603, further comprising using deionized water (DIW) or carbon dioxide deionized water to rinse the substrate surface for removing the substrate surface contaminants and the remaining chemical liquid on the surface of the substrate.

Figure 7:
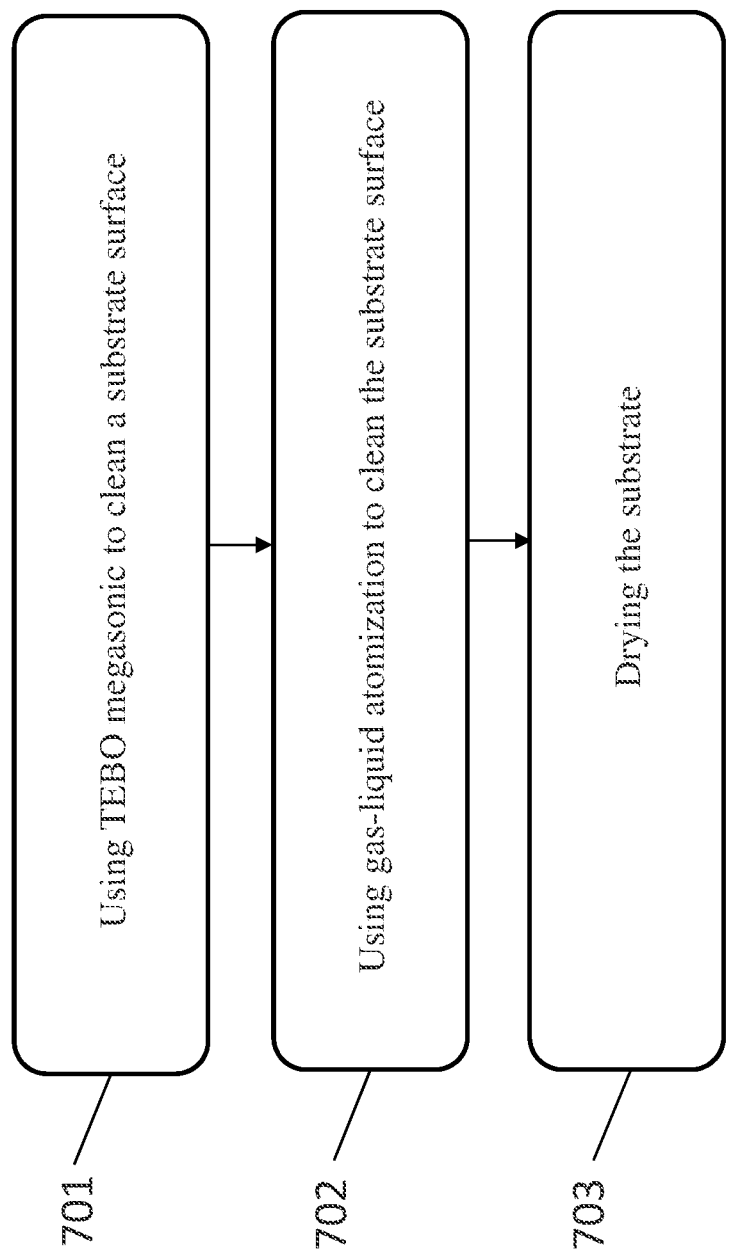
FIG. 7 is a flow chart showing a substrate cleaning method according to another exemplary embodiment of the present invention.

Referring to FIG. 7, according to another embodiment of the present invention, a method for cleaning a substrate with pattern structures is provided, the method comprising the following steps:

Step 701: using TEBO megasonic to clean a substrate surface. TEBO megasonic combing with carbon dioxide deionized water, DIW, SC1 or some other diluted chemicals is used to clean the substrate surface for disengaging small size particles from the inside of the pattern structures and removing small size particles.

Step 702: using gas-liquid atomization to clean the substrate surface. The gas can be selected $N_2$, $CO_2$, compressed air, etc. The liquid can be selected carbon dioxide deionized water, DIW, SC1 or some other diluted chemicals. Using gas-liquid atomization to clean the substrate surface can remove large size particles. Besides, the small size particles which have been separated out from the pattern structures by the TEBO megasonic in the previous step are easier affected by the spray velocity. While using gas-liquid atomization to clean the substrate surface, the shear stress of the gas-liquid atomization removes the small size particles above the pattern structures on the substrate, which improves the small size particles cleaning efficiency.

Step 703: drying the substrate. High-speed rotary combining with nitrogen drying or IPA drying or other specially dried chemical solutions can be used to dry the substrate.

The step 701 and the step 702 can be performed alternatively several times to improve cleaning efficiency.

After the step 702, reuse TEBO megasonic to clean the substrate surface.

Before the step 703, further comprising using deionized water (DIW) or carbon dioxide deionized water to rinse the substrate surface for removing the substrate surface contaminants and the remaining chemical liquid on the surface of the substrate.

Please refer to FIG. 8. A more detailed substrate cleaning method of the present invention is provided to clean a substrate comprising pattern structures. The method comprises the following steps:

Step 1: pre-rinsing a wafer comprising pattern structures by using carbon dioxide deionized water for 5-60 seconds. The pre-rinsing is performed by delivering the carbon dioxide deionized water at a flow rate of 1.2-2.0 lpm and a temperature of 23-65° C. onto the wafer being rotated at a speed of 300-1000 rpm. The conductivity of carbon dioxide deionized water is 0.05-18 MΩ*cm.

Step 2: cleaning the wafer by employing gas-liquid atomization for 15-60 seconds. The gas can be $N_2$ and the gas flow rate is 10-100 lpm. The liquid is SC1 and the liquid flow rate is 0.1-0.3 lpm. The temperature is 23-65° C. The rotation speed of the wafer is 300-1000 rpm. The chemical mix ratio of SC1 ($NH_4OH:H_2O_2:H_2O$) is 1:4:20-1:1:500.

Step 3: rinsing the wafer by using carbon dioxide deionized water for 5-60 seconds. The rinsing is performed by delivering the carbon dioxide deionized water at a flow rate of 1.2-2.0 lpm and a temperature of 23-65° C. onto the wafer being rotated at a speed of 300-1000 rpm. The conductivity of carbon dioxide deionized water is 0.05-18 MΩ*cm.

Step 4: cleaning the wafer by employing a TEBO megasonic and SC1 for 15-300 seconds. The cleaning is performed by delivering the SC1 at a flow rate of 1.2-2.0 lpm and a temperature of 23-65° C. onto the wafer being rotated at a speed of 10-100 rpm. The chemical mix ratio of SC1 ($NH_4OH:H_2O_2:H_2O$) is 1:4:20-1:1:500. The power of megasonic wave is 10-100 watts. The duty cycle of power on is 1%-5%. The pulse period is 2-10 ms.

Step 5: rinsing the wafer by using carbon dioxide deionized water for 5-60 seconds. The rinsing is performed by delivering the carbon dioxide deionized water at a flow rate of 1.2-2.0 lpm and a temperature of 23-65° C. onto the wafer being rotated at a speed of 300-1000 rpm. The conductivity of carbon dioxide deionized water is 0.05-18 MΩ*cm.

Step 6: drying the wafer. The drying is performed by spraying nitrogen at a flow rate of 5-30 lpm and a temperature of 23-65° C. onto the wafer being rotated at a speed of 2000-2500 rpm for 20-60 seconds.

The process conditions shown in FIG. 8 also apply to the methods shown in FIG. 6 and FIG. 7.

FIG. 9 is a table showing a test result by employing the substrate cleaning method of the present invention. The test result shows that both the small particles which size is 0.5 um or less than 0.5 um and the large particles which size is greater than 0.5 um can be effectively removed. The particle remove efficiency (PRE) of both the small size particles and the large size particles can reach 100%. In one recipe, the present invention provides TEBO megasonic cleaning to remove small size particles, and combines with gas-liquid atomization cleaning to remove large size particles, achieving the maximum particle remove efficiency without or with less pattern structures damage.

Figure 10:
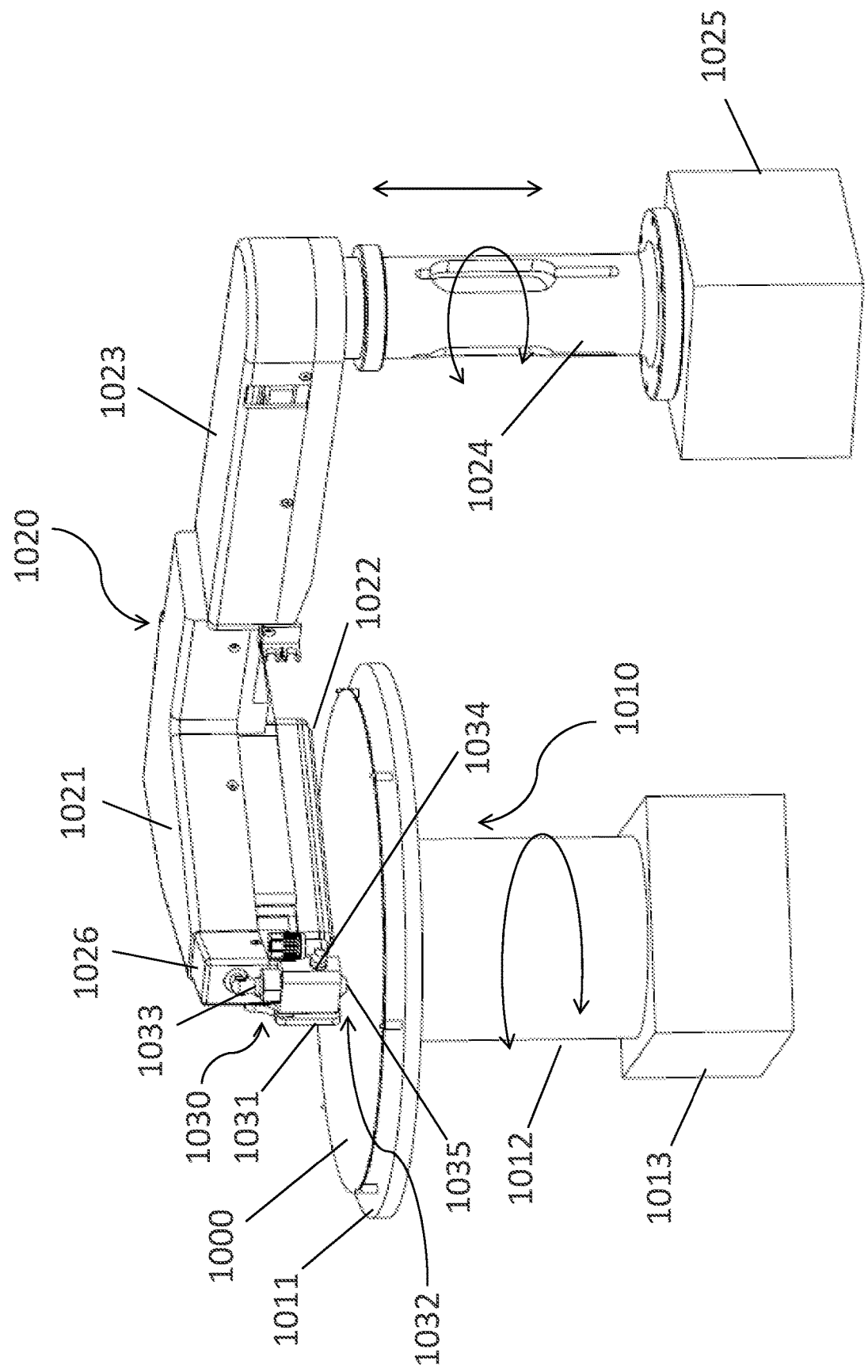
FIG. 10 is a perspective view of a substrate cleaning apparatus according to an exemplary embodiment of the present invention.
Figure 11:
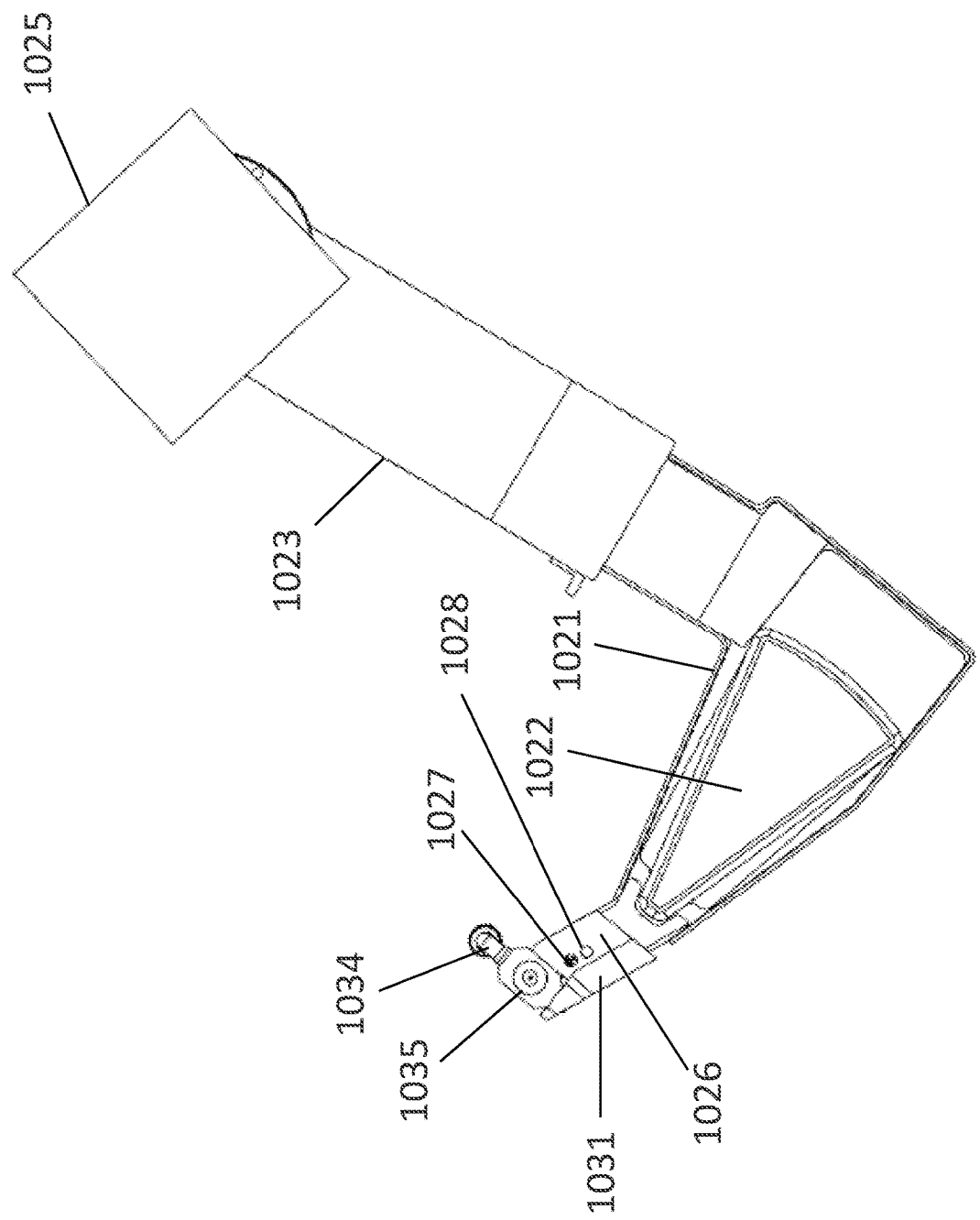
FIG. 11 is a bottom view of a substrate cleaning module of the substrate cleaning apparatus shown in FIG. 10.
Figure 12:
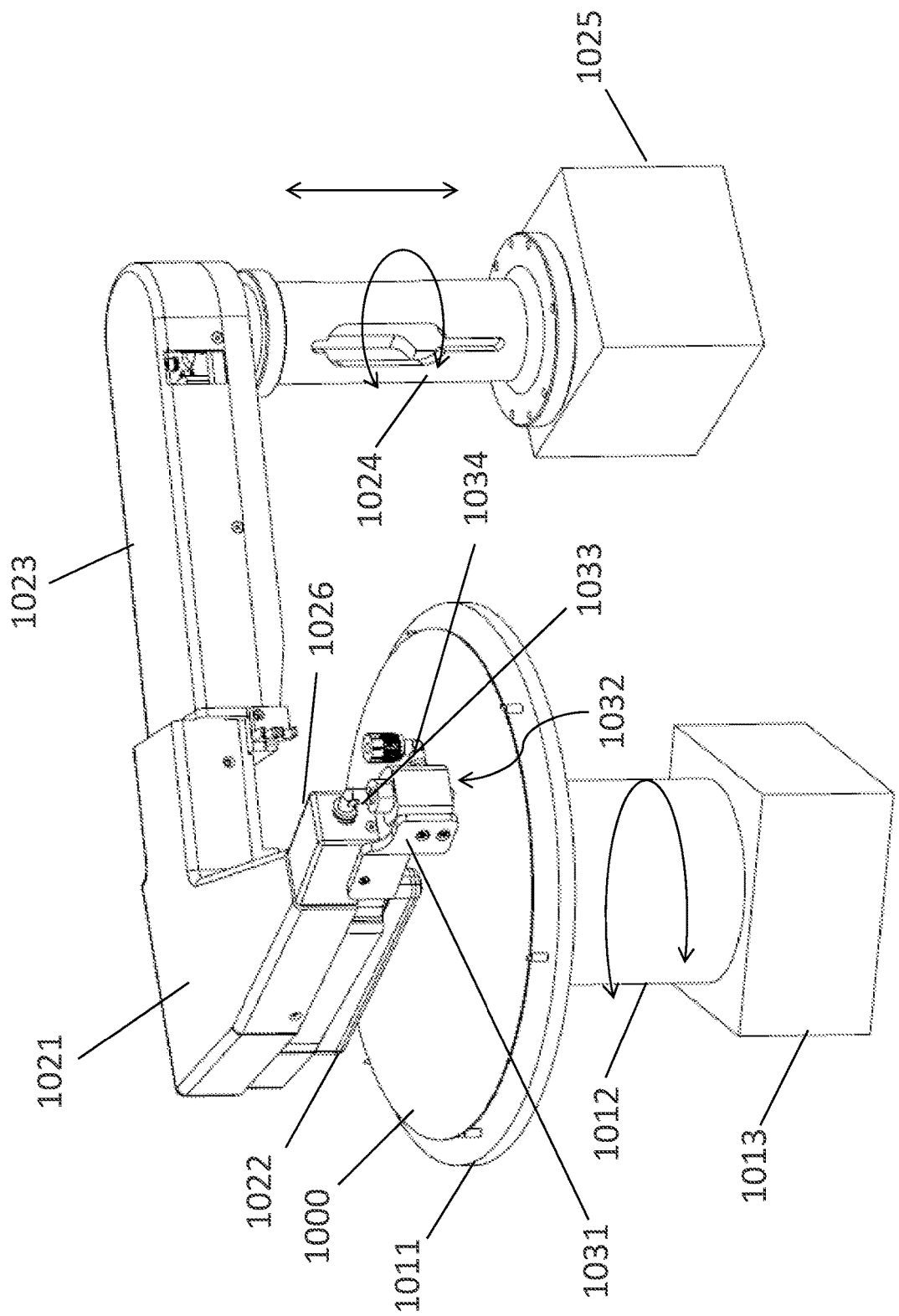
FIG. 12 is another perspective view of the substrate cleaning apparatus shown in FIG. 10.

Referring to FIG. 10 to FIG. 12, a substrate cleaning apparatus according to an exemplary embodiment of the present invention is provided. The substrate cleaning apparatus includes a substrate holding device 1010 and a substrate cleaning module. The substrate holding device 1010 is configured to hold a substrate 1000 for cleaning the substrate 1000. The substrate holding device 1010 includes a substrate chuck 1011, a rotary shaft 1012 and a driving device 1013. The substrate chuck 1011 connects to the rotary shaft 1012 and the rotary shaft 1012 connects to the driving device 1013. For cleaning the substrate 1000, the substrate 1000 is held on the substrate chuck 1011. The driving device 1013 drives the rotary shaft 1012 to rotate, thus bringing the substrate chuck 1011 as well as the substrate 1000 to rotate.

The substrate cleaning module includes a mega sonic cleaning device 1020 for providing TEBO megasonic cleaning and a gas-liquid atomization cleaning device 1030 for providing gas-liquid atomization cleaning. The mega sonic cleaning device 1020 includes a shielding cover 1021. A mega sonic device 1022 is fixed at the bottom of the shielding cover 1021. A side of the shielding cover 1021 connects to a connecting arm 1023. The connecting arm 1023 connects to a connecting spindle 1024. The connecting spindle 1024 connects to a driving mechanism 1025. The driving mechanism 1025 is capable of driving the connecting spindle 1024 to rotate and move up and down, thus bringing the mega sonic device 1022 to rotate and move up and down through the connecting arm 1023 and the shielding cover 1021. The other side of the shielding cover 1021 connects to a nozzle device 1026. The nozzle device 1026 is in front of the mega sonic device 1022. The nozzle device 1026 has a first nozzle 1027 and a second nozzle 1028 for spraying carbon dioxide deionized water, DIW, SC1 or some other diluted chemicals on the substrate 1000.

The gas-liquid atomization cleaning device 1030 has a fixing member 1031 and a gas-liquid atomization device 1032. The gas-liquid atomization device 1032 is fixed with the nozzle device 1026 by using the fixing member 1031. Therefore, the driving mechanism 1025 drives the connecting spindle 1024 to rotate and move up and down, thus bringing the gas-liquid atomization device 1032 to rotate and move up and down through the connecting arm 1023, the shielding cover 1021 and the nozzle device 1026. The gas-liquid atomization device 1032 has a liquid inlet pipe 1033, a gas inlet pipe 1034 and a jet-spray nozzle 1035 to produce atomized liquid droplets which are sprayed on the substrate 1000 through the jet-spray nozzle 1035.

When cleaning the substrate 1000 by employing the substrate cleaning apparatus, the process steps and the process conditions disclosed in FIG. 6 to FIG. 8 are applied to the substrate cleaning apparatus, so both the small particles which size is 0.5 um or less than o.5$um$ and the large particles which size is greater than 0.5 um on the substrate 1000 can be effectively removed. Moreover, in the embodiment, the mega sonic cleaning device 1020 and the gas-liquid atomization cleaning device 1030 locate in the same one process chamber and share the same one driving mechanism 1025, saving cost and space.

Figure 13:
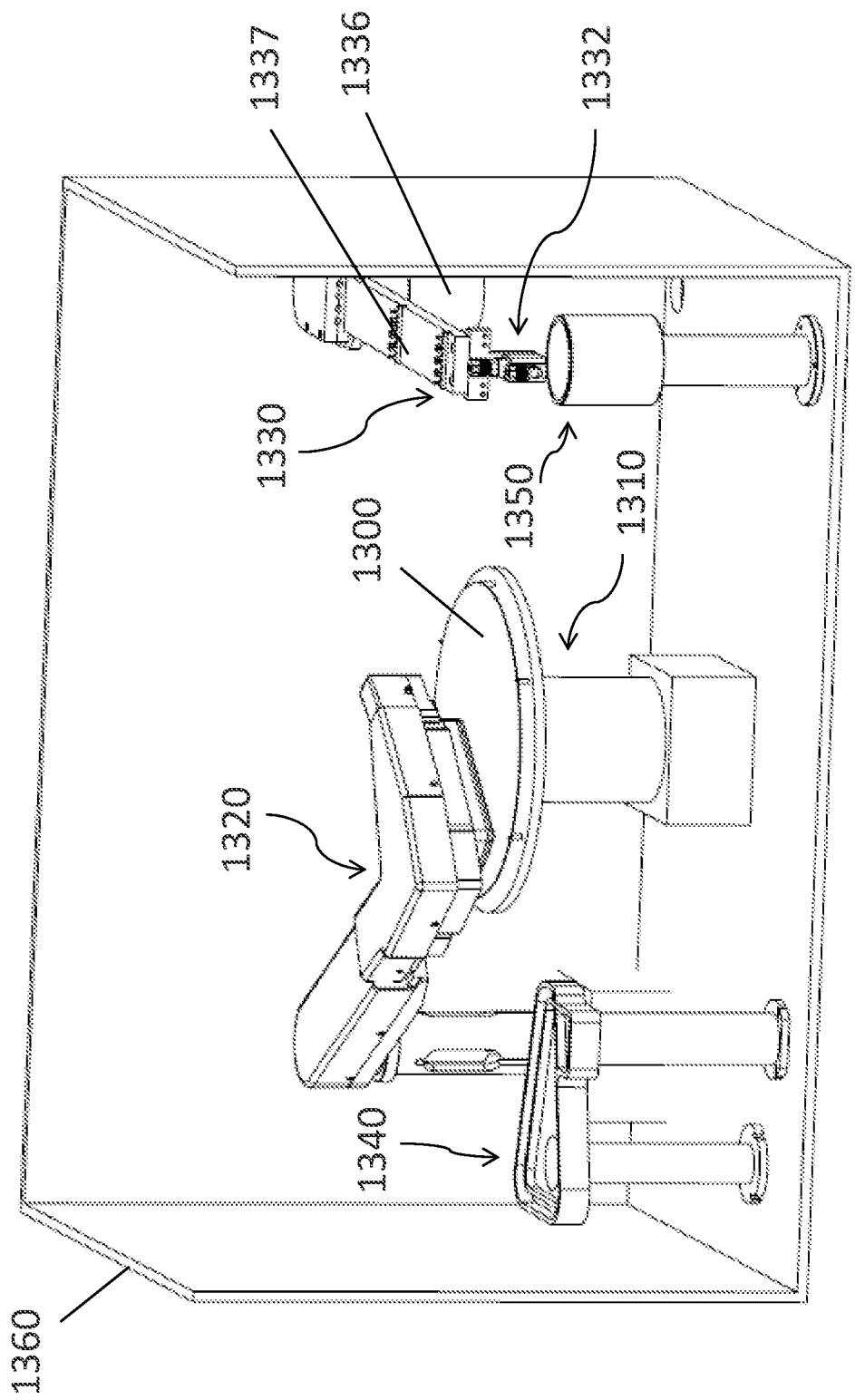
FIG. 13 is a schematic view of a substrate cleaning apparatus according to another exemplary embodiment of the present invention.
Figure 14:
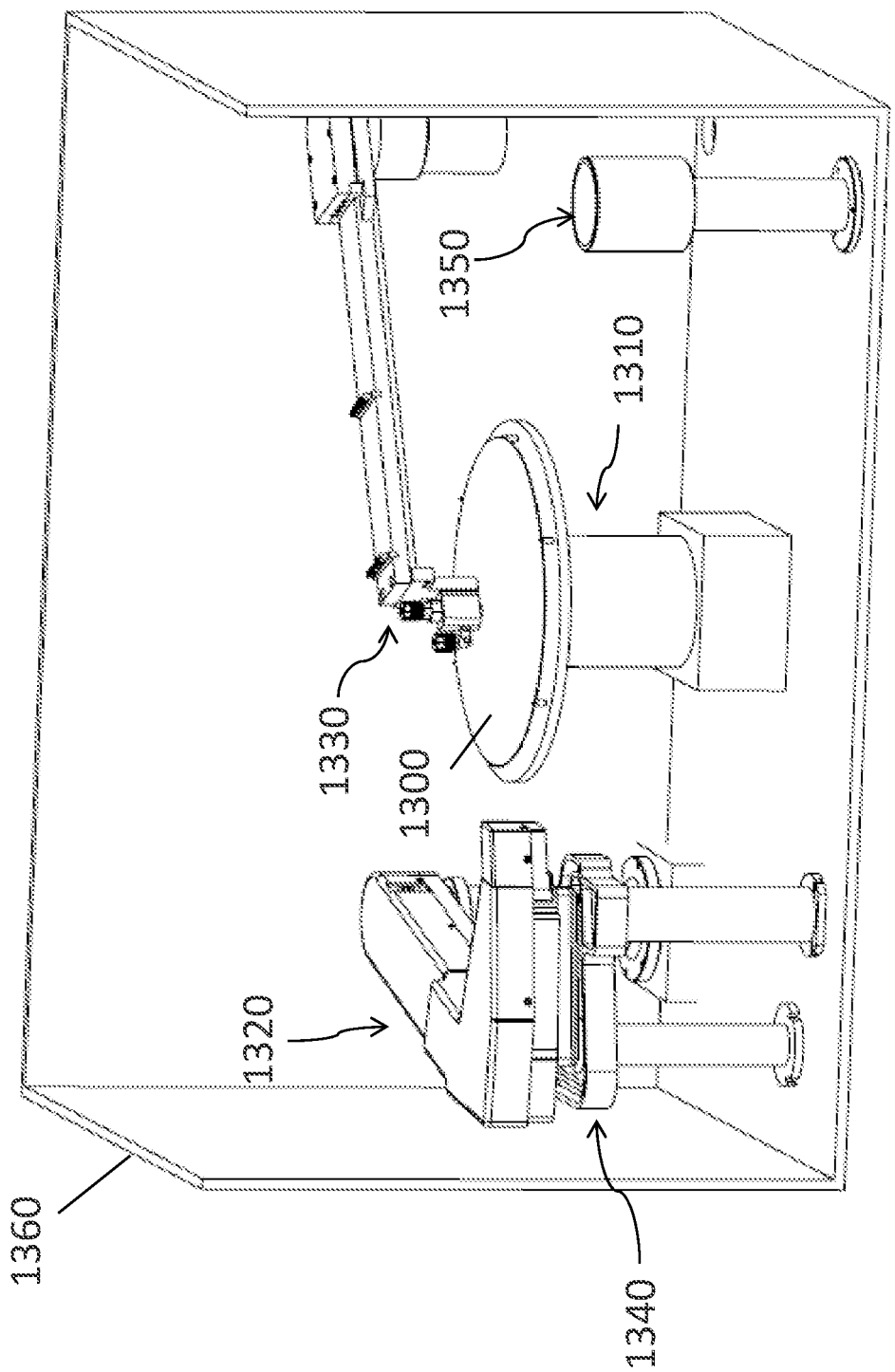
FIG. 14 is another schematic view of the substrate cleaning apparatus shown in FIG. 13.

Referring to FIG. 13 and FIG. 14, a substrate cleaning apparatus according to another exemplary embodiment of the present invention is provided. The substrate cleaning apparatus includes a substrate holding device 1310 for holding a substrate 1300, a mega sonic cleaning device 1320 for providing TEBO megasonic cleaning, a gas-liquid atomization cleaning device 1330 for providing gas-liquid atomization cleaning and a process chamber 1360. The substrate holding device 1310, the mega sonic cleaning device 1320 and the gas-liquid atomization cleaning device 1330 are located in the process chamber 1360. The substrate holding device 1310 and the mega sonic cleaning device 1320 in this embodiment is the same as the previous embodiment, which are no more duplicated descriptions herein.

The gas-liquid atomization cleaning device 1330 includes a gas-liquid atomization device 1332, a supporting arm 1337, a supporting spindle 1336 and an actuator. The gas-liquid atomization device 1332 is fixed at an end of the supporting arm 1337 and is supported by the supporting arm 1337. The other end of the supporting arm 1337 connects to the supporting spindle 1336. The supporting spindle 1336 connects to the actuator. The actuator is capable of driving the supporting spindle 1336 to rotate and move up and down, thus bringing the gas-liquid atomization device 1332 to rotate and move up and down. The gas-liquid atomization device 1332 has a liquid inlet pipe, a gas inlet pipe and a jet-spray nozzle to produce atomized liquid droplets which are sprayed on the substrate 1300 through the jet-spray nozzle.

Preferably, the substrate cleaning apparatus further includes a first cleaning groove 1340 and a second cleaning groove 1350. The first cleaning groove 1340 is configured for cleaning the mega sonic device while the mega sonic device is idle. The second cleaning groove 1350 is configured for cleaning the gas-liquid atomization device 1332 while the gas-liquid atomization device 1332 is idle.

When cleaning the substrate 1300 by employing the substrate cleaning apparatus, the process steps and the process conditions disclosed in FIG. 6 to FIG. 8 are applied to the substrate cleaning apparatus, so both the small particles which size is 0.5 um or less than 0.5 um and the large particles which size is greater than 0.5 um on the substrate 1300 can be effectively removed. Moreover, the mega sonic cleaning device 1320 and the gas-liquid atomization cleaning device 1330 locate in the same one process chamber 1360, saving cost and space.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. An apparatus for cleaning a substrate with pattern structures, comprising:
    a substrate holding device, configured to hold a substrate;
    a mega sonic cleaning device, configured to provide a cleaning liquid to the substrate, and apply mega sonic waves to the substrate, a power of the mega sonic waves is 10 to 50 watts;
    a gas-liquid atomization cleaning device, configured to provide gas-liquid atomization cleaning, a gas flow rate of the gas-liquid atomization cleaning is 20 to 40 lpm; and
    a process chamber, wherein the substrate holding device, the mega sonic cleaning device and the gas-liquid atomization cleaning device are located in the process chamber,
    wherein:
        the mega sonic cleaning device comprises:
        a shielding cover;
        a mega sonic device;
        a connecting arm; and
        a nozzle device, wherein the nozzle device comprises at least one nozzle configured to discharge liquid onto the substrate,
        the gas-liquid atomization cleaning device comprises:
        a fixing member; and
        a gas-liquid atomization device comprising a liquid inlet pipe, a gas inlet pipe, and a jet-spray nozzle,
        the mega sonic device is fixed at the bottom of the shielding cover,
        a first side of the shielding cover is connected to the connecting arm,
        a second side of the shielding cover is connected to the nozzle device,
        a first side of the fixing member is connected to the nozzle device, and
        a second side of the fixing member is connected to the gas-liquid atomization device such that the nozzle device is positioned between the shielding cover and the gas-liquid atomization device, and wherein the connecting arm is configured to support the mega sonic device, the nozzle device, and the gas-liquid atomization device above the substrate such that movement of the connecting arm can cause movement of the mega sonic device, the nozzle device, and the gas-liquid atomization device above the substrate.

2. The apparatus according to claim 1, wherein the mega sonic cleaning device comprises:
    a connecting spindle, being connected to the connecting arm; and
    a driving mechanism, being connected to the connecting spindle for driving the connecting spindle to rotate and move up and down.

3. The apparatus according to claim 1, wherein the mega sonic cleaning device is capable of removing small size particles, the size of small particles is 0.5 um or less than 0.5 um.

4. The apparatus according to claim 1, wherein the gas-liquid atomization cleaning device is capable of removing large size particles, the size of large particles is greater than 0.5 um.

* * * * *